(12) United States Patent
Takahashi

(10) Patent No.: US 7,993,462 B2
(45) Date of Patent: Aug. 9, 2011

(54) SUBSTRATE-SUPPORTING DEVICE HAVING CONTINUOUS CONCAVITY

(75) Inventor: Satoshi Takahashi, Tokyo (JP)

(73) Assignee: ASM Japan K.K., Tokyo (JP)

( * ) Notice: Subject to any disclaimer, the term of this patent is extended or adjusted under 35 U.S.C. 154(b) by 484 days.

(21) Appl. No.: 12/051,769

(22) Filed: Mar. 19, 2008

(65) Prior Publication Data

US 2009/0239385 A1 Sep. 24, 2009

(51) Int. Cl.
*C23C 16/00* (2006.01)
*C23C 16/50* (2006.01)
*C23F 1/00* (2006.01)
*H01L 21/306* (2006.01)

(52) U.S. Cl. ..... 118/728; 118/715; 118/722; 118/723 R; 156/345.1; 156/345.51

(58) Field of Classification Search ............... 118/724, 118/728; 156/345.51, 345.52, 345.53, 345.54, 156/345.55
See application file for complete search history.

(56) References Cited

U.S. PATENT DOCUMENTS

| | | | | |
|---|---|---|---|---|
| 4,361,749 | A | * | 11/1982 | Lord ......................... 219/121.4 |
| 5,470,661 | A | | 11/1995 | Bailey et al. |
| 5,531,835 | A | * | 7/1996 | Fodor et al. ................... 118/728 |
| 5,802,856 | A | * | 9/1998 | Schaper et al. .................. 62/3.7 |
| 5,810,933 | A | * | 9/1998 | Mountsier et al. ............ 118/724 |
| 6,187,691 | B1 | | 2/2001 | Fukuda et al. |
| 6,271,148 | B1 | | 8/2001 | Kao et al. |
| 6,329,297 | B1 | | 12/2001 | Balish et al. |
| 6,347,636 | B1 | | 2/2002 | Xia et al. |
| 6,352,945 | B1 | | 3/2002 | Matsuki et al. |
| 6,374,831 | B1 | | 4/2002 | Chandran et al. |
| 6,383,955 | B1 | | 5/2002 | Matsuki et al. |
| 6,387,207 | B1 | | 5/2002 | Janakiraman et al. |
| 6,428,894 | B1 | | 8/2002 | Babich et al. |
| 6,482,740 | B2 | | 11/2002 | Soininen et al. |
| 6,534,395 | B2 | | 3/2003 | Werkhoven et al. |
| 6,846,213 | B2 | * | 1/2005 | Sato .................................. 445/6 |
| 7,691,205 | B2 | * | 4/2010 | Ikedo ............................ 118/728 |
| 2001/0054389 | A1 | * | 12/2001 | Sago et al. .................... 118/728 |
| 2002/0011210 | A1 | | 1/2002 | Satoh et al. |
| 2002/0189940 | A1 | * | 12/2002 | Tsai et al. ................. 204/298.15 |

(Continued)

FOREIGN PATENT DOCUMENTS

KR 1020050103373 10/2005

OTHER PUBLICATIONS

Stephen Rossnagel, "The latest on Ru-Cu interconnect technology," *Solid State Technology*, Feb. 2005 Online, pp. 1-4.

(Continued)

*Primary Examiner* — Maureen Gramaglia
*Assistant Examiner* — Tiffany Nuckols
(74) *Attorney, Agent, or Firm* — Knobbe Martens Olson & Bear LLP

(57) ABSTRACT

A substrate-supporting device has a top surface for placing a substrate thereon composed of a plurality of surfaces separated from each other and defined by a continuous concavity being in gas communication with at least one through-hole passing through the substrate-supporting device in its thickness direction. The continuous concavity is adapted to allow gas to flow in the continuous concavity and through the through-hole under a substrate placed on the top surface.

18 Claims, 3 Drawing Sheets

U.S. PATENT DOCUMENTS

| | | |
|---|---|---|
| 2003/0091938 A1 | 5/2003 | Fairbairn et al. |
| 2004/0005753 A1 | 1/2004 | Kostamo et al. |
| 2005/0112509 A1 | 5/2005 | Fairbairn et al. |
| 2005/0124154 A1 | 6/2005 | Park et al. |
| 2005/0181555 A1 | 8/2005 | Haukka et al. |
| 2006/0084280 A1 | 4/2006 | Matsuki et al. |
| 2006/0177601 A1 | 8/2006 | Park et al. |
| 2006/0216932 A1 | 9/2006 | Kumar et al. |
| 2007/0059502 A1 | 3/2007 | Wang et al. |
| 2007/0128889 A1 | 6/2007 | Goto et al. |
| 2007/0190782 A1 | 8/2007 | Park et al. |
| 2007/0218705 A1 | 9/2007 | Matsuki et al. |
| 2007/0248767 A1 | 10/2007 | Okura et al. |
| 2008/0054472 A1 | 3/2008 | Shinriki et al. |
| 2008/0124484 A1 | 5/2008 | Shinriki et al. |
| 2008/0171436 A1 | 7/2008 | Koh et al. |

OTHER PUBLICATIONS

C.C. Yang et al., "Physical, Electrical, and Reliability Characterization of Ru for Cu Interconnects," *2006 International Interconnect Technology Conference*, pp. 187-190, ISBN 1-4244-0103-8/06, 2006 IEEE.

K. Namba et al., "PEALD of Ru layer on WNC ALD barrier for Cu/porous low-k integration," *Proceedings of Advanced Matallization Conference 2006*, p. 39.

Seong-Jun Jeong et al., "Plasma Enhanced Atomic Layer Deposition of Ru-Tan Thin Films for the Application of Cu Diffusion Barrier," pp. 1-23, *ALD Conference* 2006.

I. Shao et al., "An alternative low resistance MOL technology with electroplated rhodium as contact plugs for 32 nm CMOS and beyond,"*2007 International Interconnect Technology Conference*, pp. 102-104, ISBN 1-4244-1070-3/07, 2007 IEEE.

V. Arnal et al., "Material and processes for high signal propagation performance and reliable 32 nm node BEOL," *2007 International Interconnect Technology Conference*, pp. 1-3, ISBN 1-4244-1069-X/07, 2007 IEEE.

Morisada et al., Method of Self-Cleaning of Carbon-Based Film, U.S. Appl. No. 11/868,437, filed Oct. 5, 2007.

H. Shinriki et al., Ruthenium Alloy Film for Copper Interconnects, U.S. Appl. No. 12/129,345, filed May 29, 2008.

* cited by examiner

SUBSTRATE-SUPPORTING DEVICE HAVING CONTINUOUS CONCAVITY

BACKGROUND OF THE INVENTION

1. Field of the Invention

The present invention generally relates to a surface configuration of a substrate-supporting device for a semiconductor-processing apparatus.

2. Description of the Related Art

In semiconductor manufacturing apparatuses, the susceptor plays the role of supporting the substrate. Accordingly, the susceptor surface is sometimes processed for the purposes of reducing foreign matters attaching to the back of the substrate, preventing the substrate from sticking, and so on.

As for the surface irregularity added to the susceptor by the aforementioned processing, the concaves do not contact the back of the substrate, while the convexes contact the back of the substrate and thereby support the substrate. This configuration has been shown to be very effective in reducing foreign matters attaching to the back of the substrate and preventing the substrate from sticking, as mentioned above. On the other hand, however, such configuration can cause the substrate to slide over the susceptor when the process conditions are changed while a film is being formed or during the cycle purge performed after a film has been formed. Transfer errors occurring when the substrate is transferred out after the film forming process, and non-uniform film thicknesses, have been reported due to this sliding.

SUMMARY OF THE INVENTION

In an embodiment wherein one or more of the above problems can surprisingly be solved, the present invention provides a substrate-supporting device having a top surface for placing a substrate thereon composed of a plurality of surfaces separated from each other and defined by a continuous concavity being in gas communication with at least one through-hole passing through the substrate-supporting device in its thickness direction, said continuous concavity being adapted to allow gas to flow in the continuous concavity and through the through-hole under a substrate placed on the top surface. The present invention further relates to a semiconductor-processing apparatus comprising the substrate-supporting device and a method for forming a film on a substrate using the substrate-supporting device.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
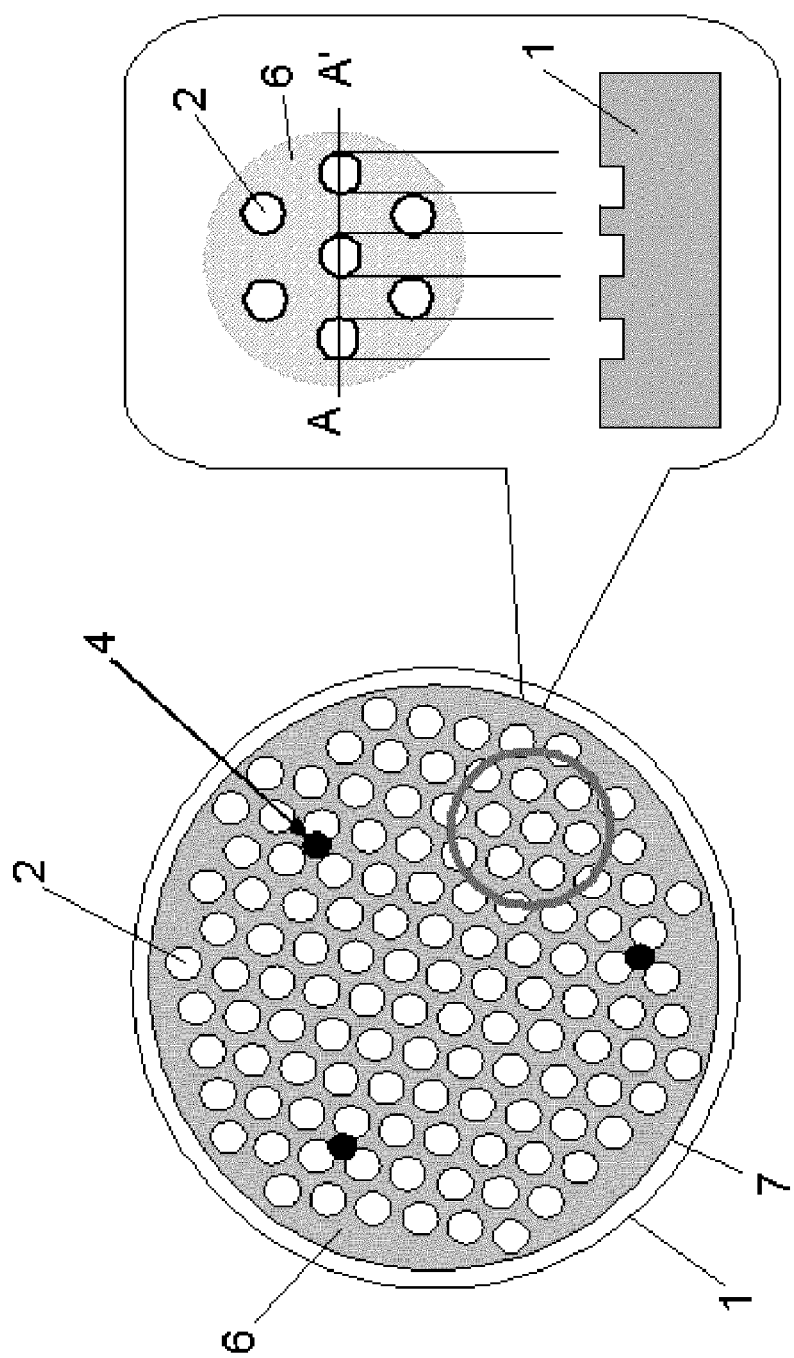
FIG. 1 shows a schematic top view of a comparative susceptor and a partially enlarged schematic view of depressions and their cross section.

In an embodiment of the present invention, the following two points are added to the process of deciding the susceptor surface configuration: [1] connect the concaves using channels, and [2] in the area around the channels for wafer support pins passing through the susceptor, add concaves of a shape different from the concaves on the susceptor surface. These concaves of a different shape are provided to cause the through-holes for support pins to effectively connect to the concaves. In another embodiment of the present invention, concaves are formed continuously and connected to through-holes provided in the susceptor. These through-holes need not be those for support pins, but if the susceptor is a heater block (HB), the susceptor structure houses built-in heating wires and thus there is a limited design freedom to provide through-holes. Also, plasma may be impressed without transferring the substrate (wafer), in which case providing simple through-holes can cause abnormal discharge. Even if support pins (lift pins) are used, however, setting the pin height too low still causes unstable discharge and eventually leads to abnormal discharge. The lift pins are used in transfer, and it is possible to replace the lift pins with other method. However, use of the lift pins provides a couple of advantages, such as 1) through-holes for these pins are already provided, and 2) since the lift pins are present in the holes, abnormal discharge caused by simple holes can be prevented. For these reasons, preferably the holes for lift pins should be used as the aforementioned through-holes. For your reference, the through-hole for lift pin has an outer diameter of approx. 2 to 8 mm.

In an embodiment, the outer periphery of the susceptor is intentionally shaped in such a way that the top face of the susceptor always contacts the wafer. What this means is that the susceptor area where a regular concave pattern has been added is made smaller than the wafer area. This is because if the concaves are open to the atmosphere through the outer periphery, the material gases needed to form a film enter this area and a film will be formed at the back of the wafer, too. Since formation of a film at the back of the wafer causes problems in the subsequent processes, it is desired that the wafer always come in contact with the susceptor at the outer periphery to prevent a film from being formed at the back of the wafer.

By adopting this susceptor surface configuration, it becomes possible for the gases between the substrate and susceptor surface (gases existing below the back of the substrate) to move along the aforementioned concave structure and flow through the through-holes when the pressure or gas flow rate in the reaction chamber changes. In an embodiment, the concave has a cylindrical shape or a reversed cone shape without tip. However, its cross-section shape may be a triangle, square, pentagon, hexagon or other polygon or even oval, in addition to a circle. In an embodiment, the concave has a trapezoidal shape. Ideally, the concaves should have the same size and shape and be distributed roughly uniformly over the entire top face of the susceptor. The channels (or grooves) connecting these concaves only need to link and connect the concaves and can have any longitudinal cross-section shape such as a reversed triangle, circle, or oval, in addition to a square. The depth of the channel is about the same as the concave in an embodiment, but the channel may be shallower than the concave. The width of the channel is smaller than the diameter of the concave in an embodiment. However, making the channel too shallow increases the exhaust conductance (exhaust resistance), which prevents sufficient evacuation of gases and may hinder the achievement of the expected anti-sliding effect.

In other embodiments, the present invention includes the following structures. It should be noted, however, that these structures are not intended to limit the present invention in any way. These embodiments (including the aforementioned embodiments and embodiments explained below) may be combined or used independently.

1) The concaves may be arranged so that every concave forms a regular hexagon with five other concaves, or in a grid form.

2) The adjacent concaves are linked by a channel. Linking the adjacent concaves with a channel allows evacuation of the interior of the concaves.

3) The contact area with the substrate is 10 to 50% of the total area. By reducing the contact area, sticking of the substrate and attachment of foreign matters to the back of the substrate can be prevented.

4) The top face of the convex is flat. In an embodiment, the concave is a trapezoid (diameter of the opening>diameter of the bottom face), and typically the top face of the convex is flat.

5) The distance between the centers of concaves is constant (the channel length is constant). Basically, this relationship holds regardless of whether the concaves are arranged in a grid form or close-packed pattern.

6) The width of the channel is smaller than the diameter of the concave.

The present invention will be explained with respect to preferred embodiments. The preferred embodiments are not intended to limit the present invention.

In an embodiment, the present invention provides a substrate-supporting device having a top surface for placing a substrate thereon composed of a plurality of surfaces separated from each other and defined by a continuous concavity being in gas communication with at least one through-hole passing through the substrate-supporting device generally in a thickness direction, said continuous concavity being adapted to allow gas to flow in the continuous concavity and through the through-hole under a substrate placed on the top surface.

The above embodiment further includes, but is not limited to, the following embodiments:

In an embodiment, the continuous concavity may comprise: (i) a plurality of main depressions or dimples; (ii) depressed channels connecting substantially or nearly every two adjacent depressions; and (iii) at least one depression, each formed in the vicinity of and around the through-hole.

In any of the foregoing embodiment, the at least one through-hole may include at least one through-hole used for a substrate lift pin. In an embodiment, the number of the through-holes may be three or more. The use of through-holes for lift pins is effective because the through-holes for lift pins are typically designed so as to inhibit abnormal electric discharge when RF power is applied.

In any of the foregoing embodiment, each of the depressed channels may have substantially or nearly the same length between the main depressions or dimples. Further, in any of the foregoing embodiments, lines connecting centers of substantially or nearly every three adjacent main depressions or dimples may form an equilateral triangle except for an area where the at least one depression is formed around the through-hole, wherein the depressed channels are formed along the lines. In another embodiment, lines connecting centers of adjacent main depressions or dimples may form a rectangle, a square, another polygon, or a lattice. The depressed channels of the equal length can bring about efficient gas movement in the concavity. In an embodiment, lines connecting centers of substantially or nearly every six adjacent main depressions or dimples surrounding one main depression or dimples may form a regular hexagon, wherein the depressed channels are formed along the lines.

In any of the foregoing embodiments, the top surface may consist of a substrate-supporting area wherein the continuous concavity is fully covered by the substrate as viewed above the substrate when the substrate is placed on the substrate-supporting area. In the embodiment, the entire periphery of the substrate is in contact with the top surface or the substrate-supporting area so that substantially no gas is formed at the periphery of the substrate, thereby inhibiting a source gas from entering into the underside of the substrate.

In any of the foregoing embodiment, the main depressions or dimples may be distributed on the top surface in a geographically repeating pattern.

In any of the foregoing embodiment, each of the main depressions or dimples may have substantially the same shape and size. In an embodiment, the depressed channels may have a width smaller than a diameter of the main depressions or dimples (e.g., less than 70%, 50%, or 30%). In another embodiment, the depressed channels may have a width which is nearly the same as the diameter of the main depressions or dimples. In an embodiment, the depressed channels may have a depth which is effective to enhance gas flow in the concavity (exhaust conductance is effectively low). In an embodiment, the depth may be substantially or nearly the same as a depth of the main depressions or dimples or in another embodiment, smaller than the depth of the main depressions or dimples (e.g., less than 70%, 50%, or 30%).

In any of the foregoing embodiments, the plurality of surfaces may be arranged on a horizontal plane. In an embodiment, the plurality of surfaces are in contact with the reverse side of the substrate.

In any of the foregoing embodiment, the device may be provided with no clamping or restraining mechanism for preventing the substrate from sliding on the top surface. Even through there is no clamping or restraining mechanism, in at least one embodiment, sliding of the substrate can effectively be inhibited while processing the substrate in a reaction chamber.

In any of the foregoing embodiments, the device may be constituted by a top plate or heating block. Any suitable susceptor can be formed according to any of the foregoing embodiments.

In another aspect, the present invention provides a semiconductor-processing apparatus comprising: (I) an evacuatable reaction chamber with a gas exhaust system; (II) any one of the foregoing substrate-supporting devices disposed inside the reaction chamber; and (III) a shower plate disposed inside the reaction chamber in parallel to the substrate-supporting device. In an embodiment, the substrate-supporting device may be a heating block integrated with a heater.

In still another aspect, the present invention provides a method for forming a film on a substrate in a reaction chamber, comprising: (a) placing a substrate on any one of the foregoing substrate-supporting devices; (b) depositing a film on the substrate at a gas flow under a deposition pressure; and (c) changing the deposition pressure and/or the gas flow, thereby continuously depositing another film on top of the film formed on the substrate without being exposed to the atmosphere outside the reaction chamber. In an embodiment, the changing of the deposition pressure and/or the gas flow may be such that the substrate slides on the top surface if the substrate-supporting device has no depressed channels. In an embodiment, the deposition step may include applying RF power to the substrate.

The present invention will be explained in detail with respect to drawings. However, the drawings are not intended to limit the present invention.

Figure 3:
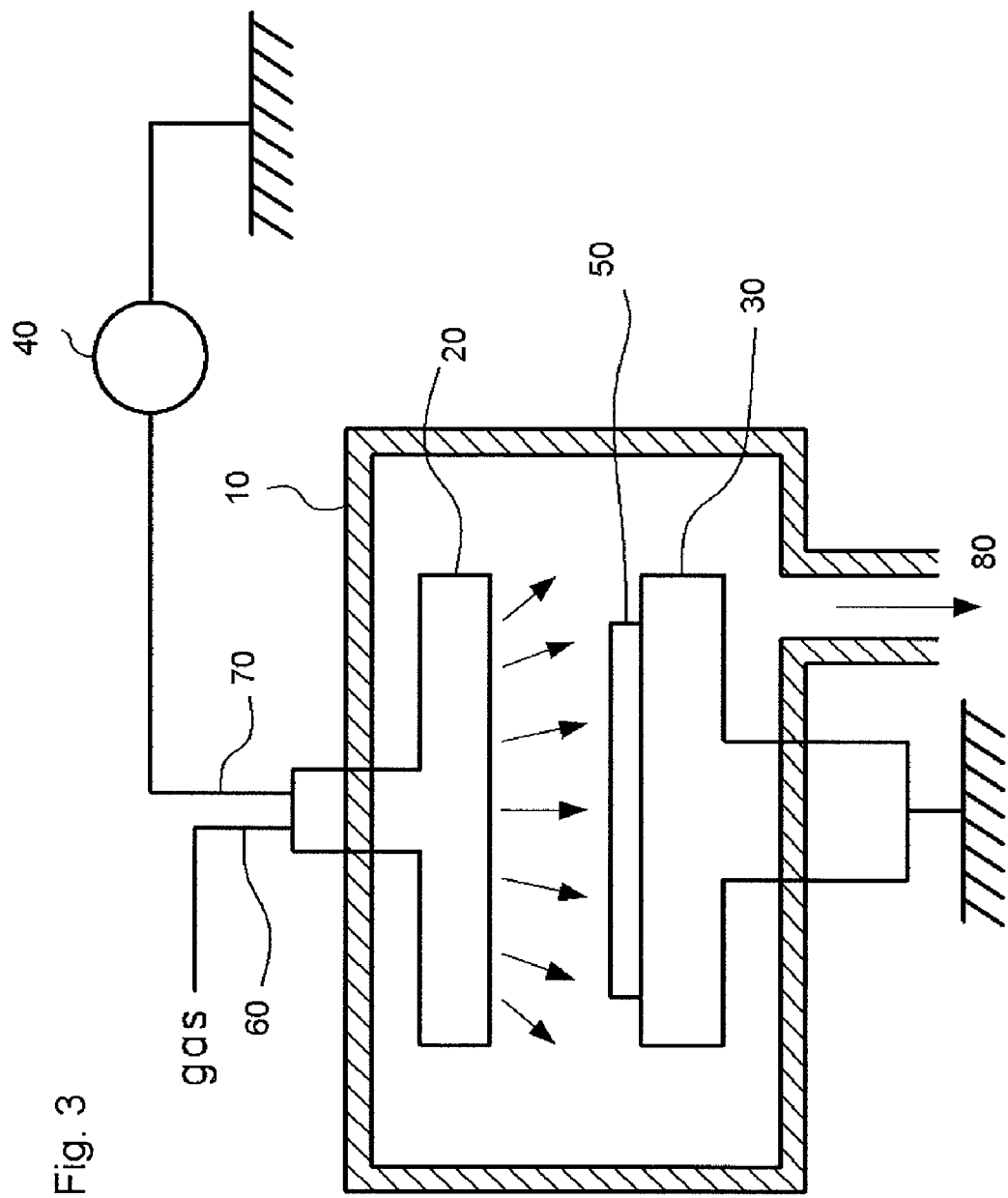
FIG. 3 shows a schematic diagram illustrating a plasma CVD apparatus usable in an embodiment of the present invention.

FIG. 3 diagrammatically shows a substrate-processing apparatus provided with any one of the foregoing susceptor in an embodiment of this invention. It need not be of PECVD, but can be of thermal CVD or plasma or thermal ALD, although the apparatus shown in FIG. 3 is of PECVD. The plasma CVD device includes a reaction chamber 10, a gas inlet port 60, a susceptor 30 (serving as a lower electrode) provided with an embedded temperature controller which can be a coil in which a coolant or heating medium flows in a channel to control the temperature. A showerhead 20 (serving as an upper electrode) may be disposed immediately under the gas inlet port. The showerhead 20 has a number of fine openings at its bottom face and can inject reaction gas to the semiconductor substrate 50 therefrom. There is an exhaust port 80 at the bottom of the reaction chamber 10. This exhaust port 80 is connected to an outer vacuum pump (not shown) so that the inside of the reaction chamber 10 can be evacuated. The susceptor 30 is placed in parallel with and facing the showerhead 20. The susceptor 30 holds a semiconductor substrate 50 thereon and heats or cools it with the temperature controller. The gas inlet port 60 is insulated from the reaction chamber 10 and connected to an outer high frequency power supply 40. Alternatively, the susceptor 30 can be connected to the power supply 40. Thus, the showerhead 20 and the susceptor 30 act as a high frequency electrode and generate a plasma reacting field in proximity to the surface of the semiconductor substrate 50.

The gases can be mixed upstream of the gas inlet port 60 to constitute a process gas, or each or some of the gases can be introduced separately into the showerhead 20. The space between the showerhead 20 and the semiconductor substrate 50, both located inside of the reaction chamber 10 which is already evacuated, is charged with RF power which has a single frequency or mixed frequencies (e.g., 13.56 MHz to 60 MHz), and the space serves as a plasma field. The susceptor 30 continuously heats or cools the semiconductor substrate 50 with the temperature controller and maintains the substrate 50 at a predetermined temperature that is desirably −50° C.-350° C. The process gas supplied through the fine openings of the showerhead 20 remains in the plasma field in proximity to the surface of the semiconductor substrate 50 for a predetermined time.

When the film is deposited on the substrate, the gas inside the reaction chamber is discharged through the exhaust port 80 and replaced with a reduction gas or a mixture of a reduction gas and an inert gas, while maintaining the substrate in the reaction chamber.

FIG. 1 shows an example of the susceptor surface configuration provided for comparison purposes.

In semiconductor manufacturing, semiconductor devices are manufactured by combining films offering different characteristics as necessary. To form films of different types, a general approach is to form the base film, and then remove the semiconductor substrate into atmosphere before implementing the next film forming step. However, the demand is increasing of late to change the process conditions while the base film is still being formed to continuously form films of different types in order to avoid exposure to atmosphere.

In such application, various process conditions are changed continuously. Since films formed in such transient state have characteristics different from the desired characteristics, ideally the transient time should be kept as short as possible. However, changing the process conditions over a short period of time causes the semiconductor substrate to slide. This problem is particularly prominent when the deposition pressure and gas flow rate are changed.

This problem occurs because changes in conditions during the film forming process cause the process atmosphere trapped inside concaves 2 in FIG. 1 to release to the outside through the space between the substrate-supporting device and the back of the substrate due to a rapid change in the pressure, gas flow rate, etc. This causes the substrate to float and slide. In FIG. 1, many concaves 2 of cylindrical shape are provided in a substrate-supporting area 7 of a susceptor 1 (refer to the enlarged view of section A-A'). The distance between the centers of adjacent concaves 2 is roughly constant. The susceptor 1 shown in FIG. 1 has dimple-like concaves 2 on a substrate-supporting surface 6 and the substrate-supporting surface 6 is a continuous plane. Through-holes for substrate support pins 4 are arranged irrespective of the pattern of concaves 2.

Figure 2:
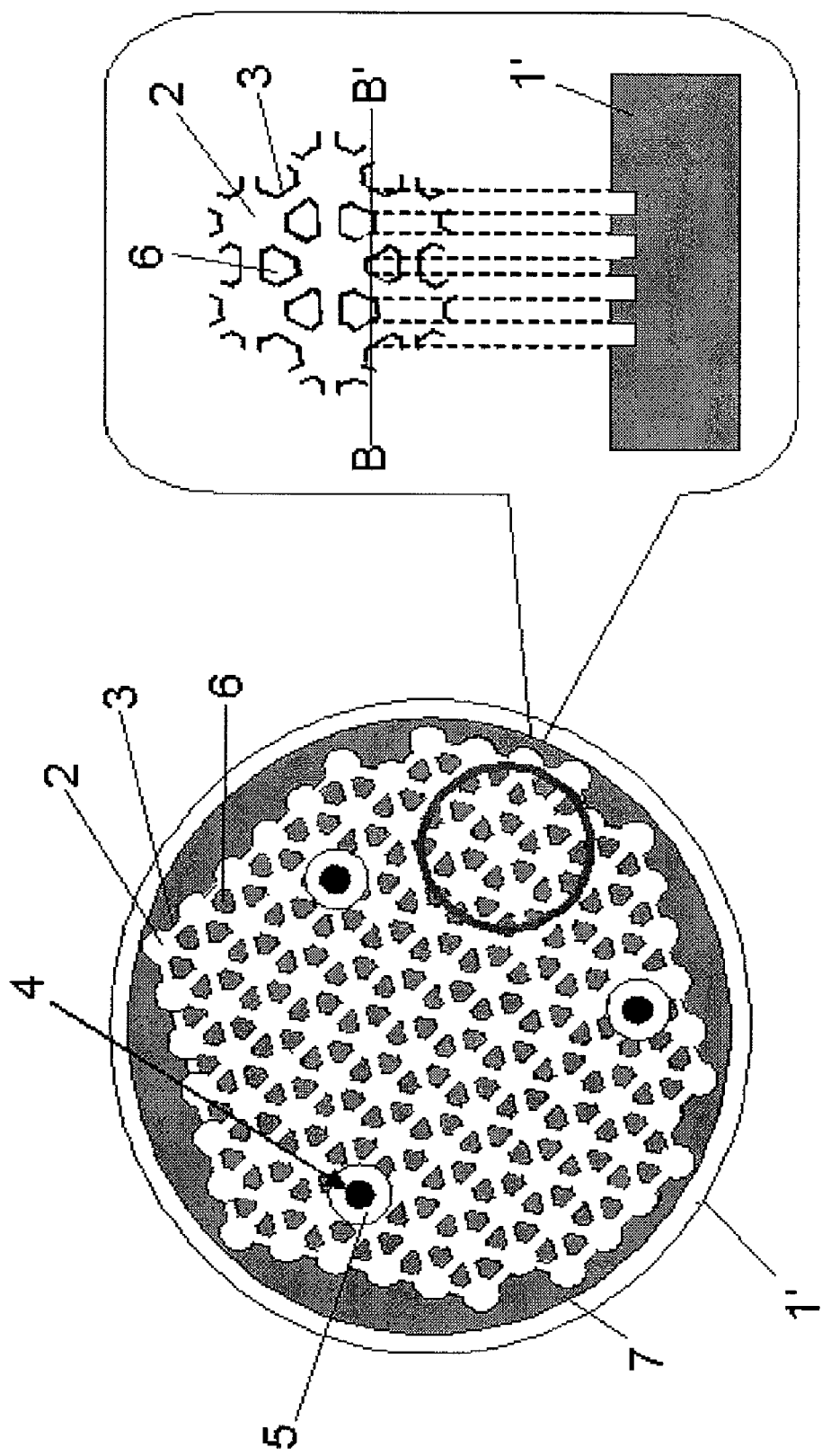
FIG. 2 shows a schematic top view of a susceptor and a partially enlarged schematic view of depressions and their cross section according to an embodiment of the present invention.

Accordingly, in an embodiment of the present invention these concaves are connected with channels and then concaves, independent from the concaves/convexes on the susceptor surface, are created around the holes for wafer support pins passing through the substrate-supporting device (refer to FIG. 2). In other words, a susceptor 1' shown in FIG. 2 has many concaves 2 in the substrate-supporting area 7 just like the one in FIG. 1, and connecting the centers of three adjacent concaves forms a regular triangle. (For your reference, although the concave diameter in FIG. 2 is larger than the concave diameter in FIG. 1, this is for the purpose of illustrating the relationship with a channel 3 and the concave diameter in FIG. 2 is virtually the same as the concave diameter in FIG. 1 in this embodiment.) Also, connecting the centers of six concaves adjacent to a given concave forms a regular hexagon. Each concave 2 is linked by a channel 3, and the longitudinal cross-section of the channel 3 is a rectangle (refer to the enlarged view of section B-B'). The channels 3 make the substrate-supporting surface 6 a discontinuous plane, or a group of isolated surfaces whose boundary is defined by the channels 3 and concaves 2. On the other hand, the concaves 2 also form a continuous concave structure comprising concaves connected by channels 3. Formed around the through-holes for substrate support pins 4 are concaves 5, separately from the channels 3, which are linked to other concaves 2 and channels 3. As a result, the susceptor shown in FIG. 2 has a single continuous concave structure connected to the through-hole channels for substrate support pins 4. This way, the gases trapped inside the concaves are suctioned/exhausted from the closed space constituted by the back of the substrate and the substrate-supporting device, through the channels connecting the concaves, and also through the concaves provided around the wafer support pins, when the substrate surface condition changes. As a result, sliding of the substrate can be prevented.

The substrate structure shown in FIG. 2 is explained below. Shown in parentheses are the values used in the example explained below. For your reference, the concave in the structure shown in FIG. 1 has the same shape as the concave in FIG. 2.

Number of concaves: In a range of 300 to 1000 (Example: 650)
Concave diameter: In a range of Ø2.0 to 17.0 (Example: 9.0)
Concave depth: In a range of 0.05 to 0.5 (Example: 0.15)
Distance between concave centers: In a range of 5 to 20 (Example: 11.5 mm)
Channel width: In a range of 1.0 to 10.0 (Example: 2.0)
Channel depth: In a range of 0.05 to 0.5 (Example: 0.2)
Susceptor material: Aluminum (Example: Aluminum)
Susceptor thickness: In a range of 30 to 120 (Example: 45 mm)
Susceptor diameter: In a range of 305 to 380 (Example: 345)

Table 1 shows the frequencies of transfer errors occurring when a film was formed under a given set of conditions (recipe A explained later) using the substrate-supporting device shown in FIG. 1 and when a film was formed under the same recipe A using the substrate-supporting device shown in FIG. 2. As shown in this table, the occurrences of transfer errors due to substrate sliding, etc., were suppressed effectively to an amazing degree by using the substrate-supporting device in FIG. 2. It is also shown that the film uniformity and number of particles improved significantly.

The criteria for an "OK" judgment in Table 1 are as follows (criteria used in this example):
Uniformity: OK if the RM is 4% or less. NG if the RM is 4% or more.
Wafer slide: OK if the wafer does not displace during the process. NG if the wafer displaces. (Displacement is checked visually.)
Transfer error: OK if the apparatus does not stop due to a transfer error. NG if the apparatus aborts.
Particle: OK if there are no more than 30 particles. NG if there are more particles.

TABLE 1

|  | Experiment | | | |
| --- | --- | --- | --- | --- |
|  | 1 | 2 | 3 | 4 |
| Depo Recipe* | A | B | A | B |
| Heater Block | FIG. 1 | FIG. 1 | FIG. 2 | FIG. 2 |
| Uniformity | NG | OK | OK | OK |
| Wafer slide | NG | OK | OK | OK |
| Transfer error | NG | OK | OK | OK |
| Particle | NG | OK | OK | OK |

For your information, according to Table 1 no significant differences were found between the susceptors in FIG. 1 and FIG. 2 under recipe B. Recipes A and B are as follows:

Recipe A: Precursor flow: 200-250→50-120 sccm, Additive gas: 120-170 sccm, Press: 650-750 Pa→500-600 Pa, RF power: 2500-3200→3500-4000 W Recipe B: Precursor flow: 200-250 sccm, Additive gas: 100-200 sccm, Press 500-600 Pa, RF-power: 2900-3500 W Although the results under recipes A and B are different according to the table shown above, recipe A includes "transition control," while recipe B does not. Transition control is a control whereby the deposition pressure and gas flow rate are changed while a film is being formed to form two types of films offering different characteristics at once. In general plasma CVD, the gas flow rate, pressure and other film forming conditions are generally kept constant while plasma is being impressed to make the film quality uniform in the depth direction. If two different films are to be formed on top of each other, generally the bottom film is formed first, and then the wafer is transferred out of the RC, after which the wafer is transferred into the RC again to form the top film. In this case, however, the wafer is exposed to atmosphere after the bottom film is formed and before the top film is formed. Accordingly, a treatment needs to be added or cleaning performed before forming the top film in order to achieve the desired device characteristics. One such example is recipe B.

On the other hand, transition control allows the above operations to be performed at once to form both films. Recipe A adopted this transition control. To be specific, after the formation of the bottom film ends the film forming conditions quickly transit to those for the top film to allow two films to be formed in a single process. Needless to say, the transient state in which the film forming conditions for the bottom film change to those for the top film is ideally kept as short as possible. However, changing the conditions over a short period of time (especially when the gas flow rate is reduced or deposition pressure lowered) causes the gases trapped inside the concaves to release to the outside as the external pressure or gas flow rate drops. As a result, the wafer is pushed up and sliding of the wafer occurs.

In recipe B where the film forming conditions are not changed once the film forming process is started, both the susceptors in FIG. 1 and FIG. 2 function properly. Under recipe A, however, changing conditions in the middle of the film forming process causes the wafer to slide on the susceptor in FIG. 1, thereby preventing proper formation of a film. With the susceptor in FIG. 2, on the other hand, the wafer does not slide and amazingly favorable results are achieved for the formed film.

Table 2 shows the uniformity data of wafers that experienced a transfer error. As the results suggest, prevention of wafer sliding improves the uniformity to an amazing degree. For your information, a study of film thickness distribution using a 3D or 2D map will find that the film tends to become thinner around the substrate center and thicker near the periphery of the substrate. With the susceptor in FIG. 2, however, such difference in film thickness is significantly reduced. It should also be noted that little difference is found in deposition rate between the susceptors in FIG. 1 and FIG. 2. The susceptor in FIG. 2 can improve the film thickness and quality significantly without having to change the deposition rate.

TABLE 2

|  | Heater Block | |
| --- | --- | --- |
|  | FIG. 1 | FIG. 2 |
| Wafer slide | Occurred | Suppressed |
| Thickness (A) | 10,167 | 10,162 |
| Range (A) | 424 | 292 |
| RM (%) | 4.17 | 2.87 |
| Depo Rate (A/sec.) | 124.0 | 123.9 |

For your information, "R" in "RM (%)" in the above table stands for "Range," while "M" stands for "Mean." In other words, RM is a value obtained by subtracting the minimum measured wafer film thickness from the maximum measured wafer film thickness and then dividing the result by the average film thickness. RM provides an indicator of uniformity.

As explained above, changing the surface configuration of the substrate-supporting device allows favorable uniformity and particle property to be achieved while reducing foreign matters attaching to the back of the substrate and preventing the substrate from sticking or sliding.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in embodiments can be modified by a range of at least ±50% in other embodiments, and the ranges applied in embodiments may include or exclude the endpoints.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A substrate-supporting device having a top surface for placing a substrate thereon composed of a plurality of surfaces separated from each other and defined by a continuous concavity being in gas communication with at least one through-hole passing through the substrate-supporting device, said continuous concavity being adapted to allow gas to flow in the continuous concavity and through the through-hole under a substrate placed on the top surface,
wherein the continuous concavity consists of:
   (i) a plurality of circular dimple depressions each having closed bottoms;
   (ii) straightly-extending depressed channels connecting substantially or nearly every two adjacent dimple depressions, wherein the dimple depressions and the depressed channels are formed in a pattern; and
   (iii) at least one ring-shaped depression having a bottom connecting to closed bottoms of the circular dimple and bottoms of the straightly-extending depressed channels, each ring-shaped depression having a shape different from the pattern,
being formed immediately around and extending from the through-hole wherein the continuous concavity and the at least one through-hole are connected via the at least one ring-shaped depression, and wherein the at least one ring-shaped depression promotes discharging gas from the continuous concavity through the at least one through-hole, wherein the at least one through-hole is formed independently of the pattern and includes at least one through-hole used for a substrate lift pin.

2. The substrate-supporting device according to claim 1, wherein each of the depressed channels has substantially or nearly the same length between the dimple depressions.

3. The substrate-supporting device according to claim 1, wherein lines connecting centers of substantially or nearly every three adjacent dimple depressions form an equilateral triangle except for an area where the at least one ring-shaped depression is formed around the through-hole, wherein the depressed channels are formed along the lines.

4. The substrate-supporting device according to claim 1, wherein each of the dimple depressions has substantially or nearly the same shape and size.

5. The substrate-supporting device according to claim 1, wherein the depressed channels have a depth which is substantially or nearly the same as a depth of the dimple depressions.

6. The substrate-supporting device according to claim 1, wherein the top surface consists of a substrate-supporting area wherein the continuous concavity is fully covered by the substrate as viewed above the substrate when the substrate is placed on the substrate-supporting area.

7. The substrate-supporting device according to claim 1, wherein the plurality of surfaces are arranged on a horizontal plane.

8. The substrate-supporting device according to claim 1, wherein the dimple depressions are distributed on the top surface in a geographically repeating pattern.

9. The substrate-supporting device according to claim 1, which is provided with no clamping or restraining mechanism for preventing the substrate from sliding on the top surface.

10. The substrate-supporting device according to claim 1, which is constituted by a heating block wherein a heater is embedded under the top surface.

11. A semiconductor-processing apparatus comprising:
    a reaction chamber with a gas exhaust system, which reaction chamber is capable of being evacuated;
    the substrate-supporting device of claim 1 disposed inside the reaction chamber;
    a shower plate disposed inside the reaction chamber in parallel to the substrate-supporting device.

12. The semiconductor-processing apparatus according to claim 11, wherein the substrate-supporting device is a heating block integrated with a heater.

13. A method for forming a film on a substrate in a reaction chamber, comprising:
    placing a substrate on the substrate-supporting device of claim 1;
    depositing a film on the substrate at a gas flow under a deposition pressure; and
    changing the deposition pressure and/or the gas flow, thereby continuously depositing another film on top of the film formed on the substrate without being exposed to the atmosphere outside the reaction chamber.

14. The method according to claim 13, wherein the changing of the deposition pressure and/or the gas flow is such that the substrate slides on the top surface if the substrate-supporting device has no depressed channels.

15. The method according to claim 13, wherein the deposition step includes applying RF power to the substrate.

16. The substrate-supporting device according to claim 1, wherein the number of the plurality of dimple depressions is 300 to 1,000.

17. The substrate-supporting device according to claim 1, which is made of aluminum.

18. The substrate-supporting device according to claim 1, wherein the depressed channels have a width of 1.0 to 10.0 mm which is smaller than a diameter of the dimple depressions which diameter is 2.0 to 17.0 mm, and the dimple depressions and the channels have a depth of 0.05 to 0.5 mm.

* * * * *